(12) United States Patent
Jung et al.

(10) Patent No.: US 8,338,951 B2
(45) Date of Patent: Dec. 25, 2012

(54) METAL LINE OF SEMICONDUCTOR DEVICE HAVING A DIFFUSION BARRIER WITH AN AMORPHOUS TABN LAYER AND METHOD FOR FORMING THE SAME

(75) Inventors: Dong Ha Jung, Gyeonggi-do (KR); Seung Jin Yeom, Gyeonggi-do (KR); Baek Mann Kim, Gyeonggi-do (KR); Young Jin Lee, Gyeonggi-do (KR); Jeong Tae Kim, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 13/152,665

(22) Filed: Jun. 3, 2011

(65) Prior Publication Data

US 2011/0233781 A1    Sep. 29, 2011

Related U.S. Application Data

(62) Division of application No. 11/939,666, filed on Nov. 14, 2007, now Pat. No. 7,977,793.

(30) Foreign Application Priority Data

Jun. 29, 2007   (KR) .................. 10-2007-0065412

(51) Int. Cl.
H01L 23/48  (2006.01)
H01L 23/52  (2006.01)
H01L 29/40  (2006.01)

(52) U.S. Cl. ... 257/751; 257/761; 257/762; 257/E21.49; 257/E23.01; 438/643; 438/653; 438/675

(58) Field of Classification Search .................. 257/751, 257/295, E23.01, E21.49, 761, 762; 438/675, 438/643, 653
See application file for complete search history.

(56) References Cited

U.S. PATENT DOCUMENTS

| | | | |
|---|---|---|---|
| 6,320,213 B1 * | 11/2001 | Kirlin et al. | 257/295 |
| 6,445,023 B1 | 9/2002 | Vaartstra et al. | |
| 2006/0019495 A1 | 1/2006 | Marcadal et al. | |
| 2006/0120645 A1 * | 6/2006 | Toth et al. | 384/288 |
| 2007/0190780 A1 * | 8/2007 | Chung et al. | 438/675 |

FOREIGN PATENT DOCUMENTS

KR    1020030001069 A    1/2003

OTHER PUBLICATIONS

USPTO OA mailed Feb. 4, 2010 in connection with U.S. Appl. No. 11/939,666.
USPTO OA mailed Jun. 3, 2010 in connection with U.S. Appl. No. 11/939,666.
USPTO FOA mailed Nov. 17, 2010 in connection with U.S. Appl. No. 11/939,666.
USPTO NOA mailed Mar. 3, 2011 in connection with U.S. Appl. No. 11/939,666.

* cited by examiner

Primary Examiner — Cuong Q Nguyen
Assistant Examiner — Cathy N Lam
(74) Attorney, Agent, or Firm — Ladas & Parry LLP

(57) ABSTRACT

A metal line in a semiconductor device includes an insulation layer formed on a semiconductor substrate. A metal line forming region is formed in the insulation layer. A metal line is formed to fill the metal line forming region of the insulation layer. And a diffusion barrier that includes an amorphous TaBN layer is formed between the metal line and the insulation layer. The amorphous TaBN layer prevents a copper component from diffusing into the semiconductor substrate, thereby improving upon the characteristics and the reliability of a device.

6 Claims, 4 Drawing Sheets

METAL LINE OF SEMICONDUCTOR DEVICE HAVING A DIFFUSION BARRIER WITH AN AMORPHOUS TABN LAYER AND METHOD FOR FORMING THE SAME

CROSS-REFERENCE TO RELATED APPLICATIONS

The present application claims priority to Korean patent application number 10-2007-0065412 filed on Jun. 29, 2007, which is incorporated herein by reference in its entirety.

BACKGROUND OF THE INVENTION

The present invention relates to a metal line of a semiconductor device and a method for forming the same, and more particularly, to a metal line of a semiconductor device with a diffusion barrier having improved characteristics, thereby improving the characteristics and the reliability of a semiconductor device and a method for forming the same.

In general, in a semiconductor device, metal lines are formed to electrically connect elements or lines, and contact plugs are formed to connect lower metal lines and upper metal lines to each other.

Materials for the metal line of a semiconductor device typically include aluminum (Al) and tungsten (W). These materials have been used mainly due to their good electrical conductivity. Recently, research has been directed towards the use of copper (Cu) as a next-generation material for a metal line. Copper has excellent electrical conductivity and low resistance compared to aluminum and tungsten, and therefore copper can solve the problems associated with an RC signal delay in the semiconductor devices that are highly integrated and operating at a high speed.

However, copper cannot be easily dry-etched into a wiring pattern. As such, in order to form a metal line using copper, a damascene process is employed. In the damascene process, a metal line is formed by first etching an interlayer dielectric to defining a metal line forming region. After completion of the metal line forming regions, a copper layer is then filled in the metal line forming region.

The metal line forming region is formed using a single damascene process or a dual damascene process. When using the dual damascene process, an upper metal line and a contact plug for connecting the upper metal line to a lower metal line can be simultaneously formed, and since surface undulations produced due to the presence of the metal line can be removed, a subsequent process can be conveniently conducted.

When a copper layer is the material used for a metal line, unlike aluminum, a copper component diffuses through an interlayer dielectric to the semiconductor substrate. The diffused copper component acts as deep-level impurities in the semiconductor substrate made of silicon and induces a leakage current. Therefore, when using the copper layer as the material of a metal line, a diffusion barrier must be formed on the interface between the copper layer and the interlayer dielectric. Generally, the diffusion barrier is made of a single layer of a Ta layer or a TaN layer or a double layer of a Ta/TaN layer through physical vapor deposition (PVD).

However, PVD has a limit in step coverage, and a method for forming a diffusion barrier using atomic layer deposition (ALD) instead of PVD when manufacturing a semiconductor device below 30 nm has been proposed in the art. Additionally, as the design rule of a semiconductor device decreases, a method has been adopted in which ALD is used to form a thin Ru layer as a seed layer on the Ta layer or the TaN layer (also formed using ALD). A copper layer is then formed on the Ru layer using electroplating. The Ru layer has characteristics of a material that is not coupled with copper.

However, the Ru layer grows in a columnar shape, and consequently the Ru layer of the conventional art has poor structural characteristics. The Ru layer serves as a direct diffusion path between the copper layer and a lower layer, and due to the poor structural characteristics of a Ru layer, the characteristics of the diffusion barrier are degraded. As a consequence, when an annealing process is subsequently implementing, the copper component may diffuse through the diffusion barrier to the semiconductor substrate made of silicon, whereby the characteristics and the reliability of the semiconductor device are deteriorated.

SUMMARY OF THE INVENTION

Embodiments of the present invention are directed to a metal line of a semiconductor device with a diffusion barrier having improved characteristics and a method for forming the same.

Additionally, embodiments of the present invention are directed to a metal line of a semiconductor device that improves the characteristics and reliability of a semiconductor device and a method for forming the same.

In one aspect, a metal line of a semiconductor device comprises an insulation layer formed on a semiconductor substrate. The insulation layer has a metal line forming region. A metal line fills the metal line forming region of the insulation layer. A diffusion barrier is formed between the metal line and the insulation layer, and the diffusion barrier includes an amorphous TaBN layer.

The metal line forming region can have a structure including a trench or a structure including a trench and a via hole formed in the trench.

The diffusion barrier can comprise a stack of a $Ta_xB_y$ layer and the amorphous TaBN layer.

The diffusion barrier can also comprise a triple-layered structure that includes a TaN layer, a $Ta_xB_y$ layer having a hexagonal structure, and the amorphous TaBN layer.

In the $Ta_xB_y$ layer having a hexagonal structure, x has a range of 0.8~1.2 and y has a range of 1.8~2.2.

The metal line structure can further comprise a seed layer interposed between the diffusion barrier and the metal line. The seed layer can be made of an Ru layer.

The metal line is made of a copper layer.

In another aspect, a method for forming a metal line of a semiconductor device comprises the steps of forming an insulation layer having a metal line forming region on a semiconductor substrate. Forming a diffusion barrier that includes an amorphous TaBN layer on a surface of the metal line forming region. Forming a metal layer on the diffusion barrier in order to fill the metal line is forming region, and then removing the metal layer and the diffusion barrier until the insulation layer is exposed.

The metal line forming region is formed to have a structure including a trench or a structure including a trench and a via hole formed in the trench.

The step of forming the diffusion barrier comprises the steps of forming a $Ta_xB_y$ layer on a surface of the insulation layer and a surface of the metal line forming region, and then nitriding a surface of the $Ta_xB_y$ layer to form the amorphous TaBN layer.

In the $Ta_xB_y$ layer, x has a range of 0.8~1.2 and y has a range of 1.8~2.2.

It is preferred that the $Ta_xB_y$ layer is formed as a $TaB_2$ layer.

The $Ta_xB_y$ layer may be formed using CVD or ALD.

Nitriding may be implemented using nitrogen plasma.

Before forming the $Ta_xB_y$ layer, a TaN layer is formed on the surface of the insulation layer and the surface of the metal line forming region.

The TaN layer is formed using ALD.

After the step of forming the amorphous TaBN layer, the method further comprises the step of forming a seed layer, which is made of an Ru layer, on the amorphous TaBN layer.

The diffusion barrier can be made of a stack of a $Ta_xB_y$ layer and the amorphous TaBN layer.

The diffusion barrier may also comprises a triple-layered structure including a TaN layer, a $Ta_xB_y$ layer having a hexagonal structure and the amorphous TaBN layer.

The metal layer is made of a copper layer.

DESCRIPTION OF SPECIFIC EMBODIMENTS

In the present invention, when forming a metal line using a copper layer, a layer including an amorphous TaBN layer is formed as a diffusion barrier. In the present invention, after forming a $Ta_xB_y$ layer (preferably a $TaB_2$ layer) having a hexagonal structure, the amorphous TaBN layer is formed by nitriding the surface of the $Ta_xB_y$ layer. Thus, a diffusion barrier is formed having a double-layered structure including the $Ta_xB_y$ layer and the amorphous TaBN layer. Additionally, in the present invention, the $Ta_xB_y$ layer may be formed on a TaN layer and then nitrided to is form the amorphous TaBN layer. Thus, the diffusion barrier can be formed to have a triple-layered structure including the TaN layer, the $Ta_xB_y$ layer and the amorphous TaBN layer.

When the diffusion layer is formed in one of the above mentioned means, even if the copper component of the copper layer passes through a grain boundary of an Ru layer serving as a seed layer, the amorphous TaBN layer can prevent the copper component from diffusing to a semiconductor substrate, because the amorphous TaBN layer does not have a grain boundary. Accordingly, in the present invention, the characteristics of the diffusion barrier are improved, and as such, the characteristics and the reliability of a semiconductor device are improved.

Hereafter, the specific embodiments of the present invention will be described in detail with reference to the attached drawings.

Figure 1:
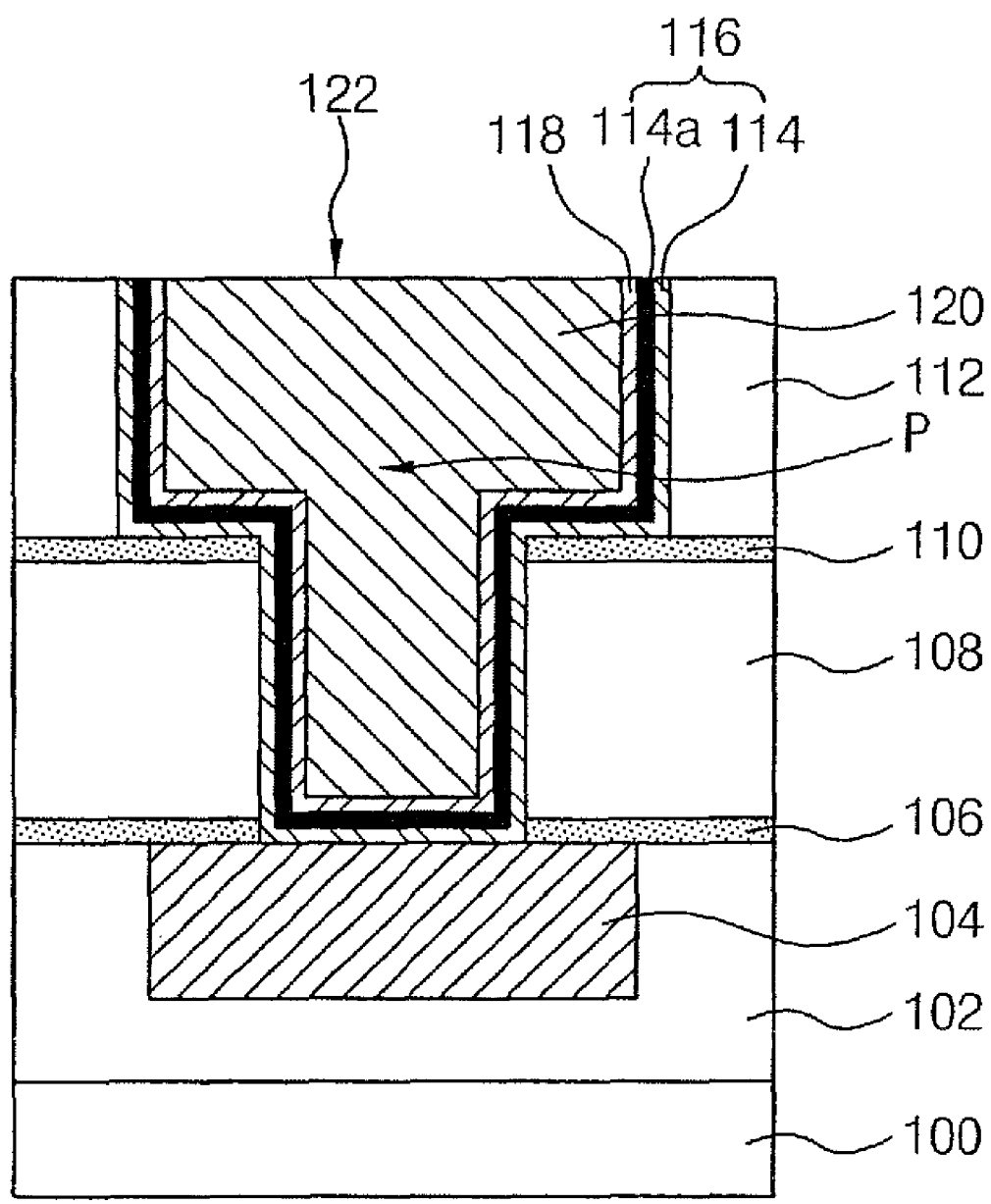
FIG. 1 is a cross-sectional view showing a metal line of a semiconductor device in accordance with an embodiment of the present invention.

FIG. 1 is a cross-sectional view showing a metal line of a semiconductor device in accordance with an embodiment of the present invention.

Referring to FIG. 1, an interlayer dielectric 102 is formed on a semiconductor substrate 100, and a lower metal line 104 is formed in the interlayer dielectric 102. First and second insulation layers 108 and 112 are sequentially formed on the interlayer dielectric 102 including the lower metal line 104. A metal line forming region P is defined in the first and second insulation layers is 108 and 112 to expose the lower metal line 104. An upper metal line 122 is formed in the metal line forming region P and comes into contact with the lower metal line 104.

The metal line forming region P can be defined to have a single structure including a trench or a dual structure including a trench and at least one via hole communicating with the trench. In the present embodiment shown in FIG. 1, the metal line forming region P is formed to have the dual structure.

A diffusion barrier 116 is formed between the upper metal line 122 and the first and second insulation layers 108 and 112. The diffusion barrier 116 has a double-layered structure including a $Ta_xB_y$ layer, preferably a $TaB_2$ layer 114 and an amorphous TaBN layer 114a. Alternatively, when a TaN layer (not shown) is placed under the $TaB_2$ layer 114, the diffusion barrier 116 can have a triple-layered structure.

The $TaB_2$ layer 114 of the diffusion barrier 116 is formed to have a hexagonal structure, and the amorphous TaBN layer 114a is formed by nitriding the surface of the $TaB_2$ layer 114. The metal layer 120 constituting the upper metal line 122 is made of a copper layer.

As described above, in the present invention, the diffusion barrier 116 is formed to have a structure including the amorphous TaBN layer 114a, making it possible to prevent the copper component of the copper layer that has passed through the grain boundary of an Ru layer 118 from diffusing downward through the diffusion layer 116. Accordingly, in the present invention, the characteristics of the diffusion barrier 116 are improved, and therefore, the characteristics and the reliability of a semiconductor device are improved.

In FIG. 1, the unexplained reference numeral 106 designates a first etch stop layer, and 110 a second etch stop layer.

FIGS. 2A through 2F are cross-sectional views illustrating steps of a method for forming a metal line of a semiconductor device in accordance with another embodiment of the present invention.

Figure 2A:
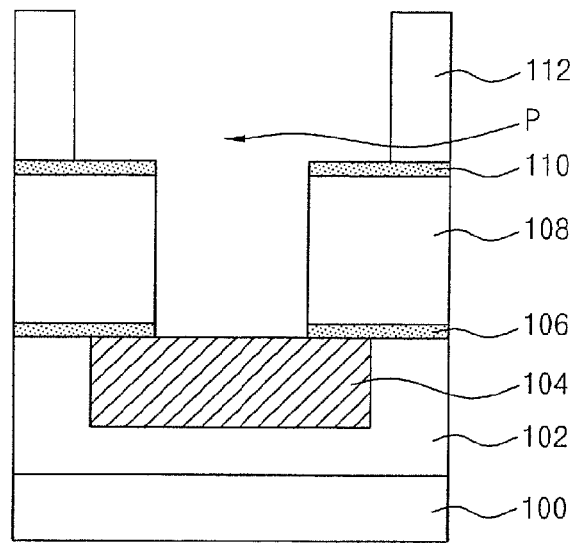
FIGS. 2A through 2F are cross-sectional views illustrating steps of a method for forming a metal line of a semiconductor device in accordance with another embodiment of the present invention.

Referring to FIG. 2A, an interlayer dielectric 102 is formed on a semiconductor substrate 100 that is formed with a lower structure (not shown) including gate lines, bit lines, capacitors, and so forth covering the lower structure. A lower metal line 104 is formed in the interlayer dielectric 102. A first etch stop layer 106, a first insulation layer 108, a second etch stop layer 110 and a second insulation layer 112 are sequentially formed on the interlayer dielectric 102 including the lower metal line 104.

The second insulation layer 112, the second etch stop layer 110, the first insulation layer 108, and the first etch stop layer 106 are etched to define a metal line forming region P in which an upper metal line is to be formed. The metal line forming region P is defined to expose the lower metal line 104. The metal line forming region P can be defined to have a single structure including a trench or a dual structure including a trench and at least one via hole communicating with the trench. In the present embodiment shown in FIGS. 2A-2F, the metal line forming region P is formed to have the dual structure.

Figure 2B:
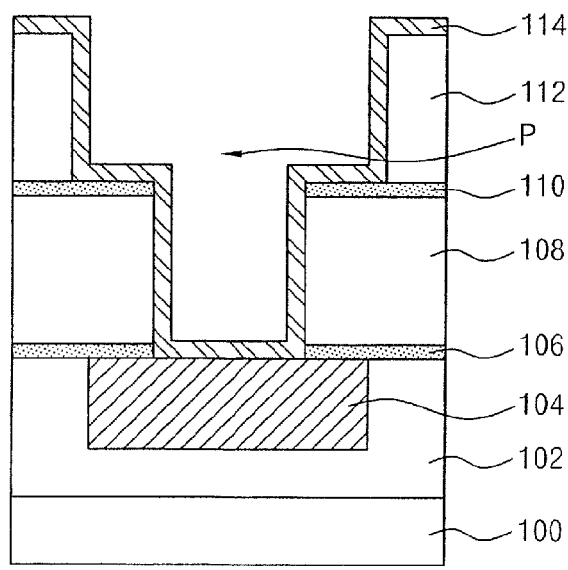

Referring to FIG. 2B, ALD is used to form a TaN layer (not shown) on the surface of the metal line forming region P, the second insulation layer 112, and the portion of the lower metal line 104 that is exposed by the metal line forming region P. A $Ta_xB_y$ layer (preferably a $TaB_2$ layer 114) is then formed on the TaN layer. It is preferred that the $TaB_2$ layer 114 be formed to have a hexagonal structure using CVD or ALD. In the $Ta_xB_y$ layer, x has a range of 0.8~1.2 and y has a range of 1.8~2.2.

Figure 2C:
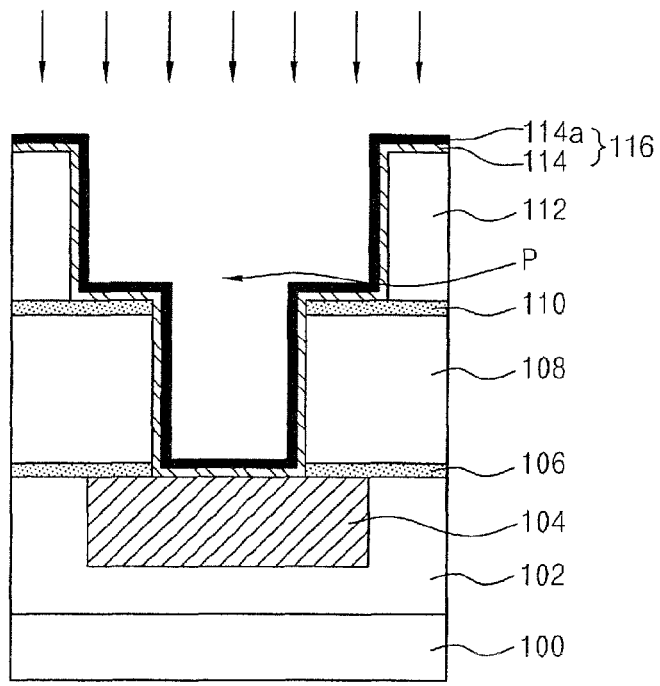

Referring to FIG. 2C, the surface of the $TaB_2$ layer 114 is nitrided using nitrogen plasma to form an amorphous TaBN layer 114a on the surface of the $TaB_2$ layer 114. The result is a diffusion barrier 116 having a stacked structure including the $TaB_2$ layer 114 and the amorphous TaBN layer 114a.

The crystallization degree of the TaB$_2$ layer 114 having the to hexagonal structure is significantly decreased, because it contains a very small amount of nitrogen atoms. The nitrogen atom content in the TaB$_2$ layer 114 is increased through a nitriding treatment using the nitrogen plasma, and the surface of the TaB$_2$ layer 114 can be made amorphous. Thus, the amorphous TaBN layer 114a is formed is on the surface of the TaB$_2$ layer 114, thereby forming the diffusion barrier 116 having the stacked structure including the TaB$_2$ layer 114 and the amorphous TaBN layer 114a.

Figure 2D:
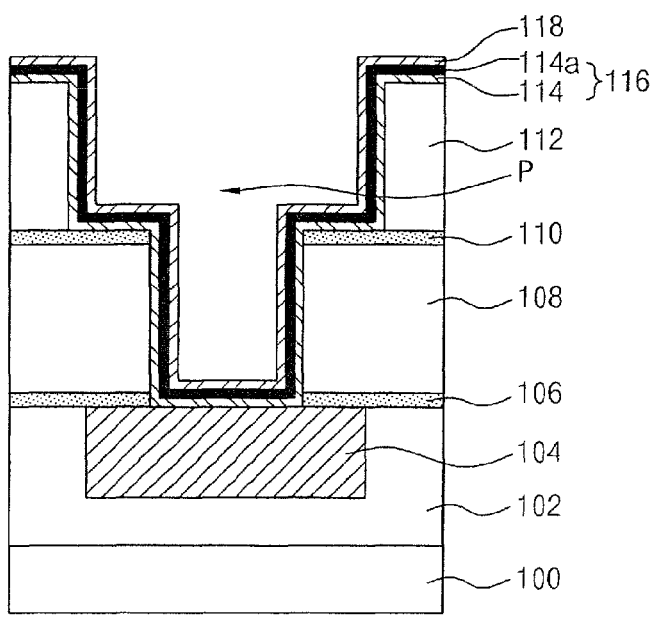

Referring to FIG. 2D, an Ru layer 118 is formed as a seed layer on the amorphous TaBN layer 114a of the diffusion barrier 116. The Ru layer 118 is formed using ALD. The Ru layer 118 improves gap fill performance when subsequently depositing a copper layer through electroplating. The Ru layer 118 has the characteristic of a material that is not coupled with the copper layer.

Figure 2E:
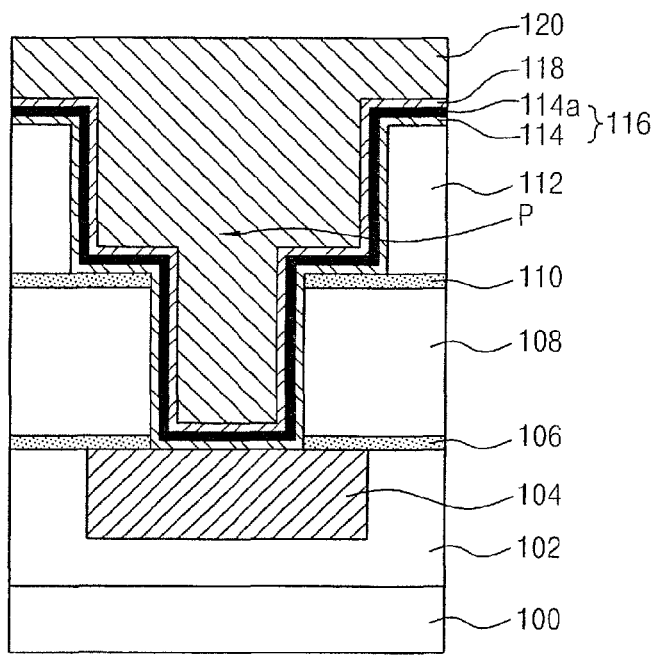

Referring to FIG. 2E, a metal layer 120 is formed on the diffusion barrier 116 including the Ru layer 118 to a thickness capable of completely filling the metal line forming region P. The metal layer 120 is made of a copper layer and is formed using electroplating.

Figure 2F:
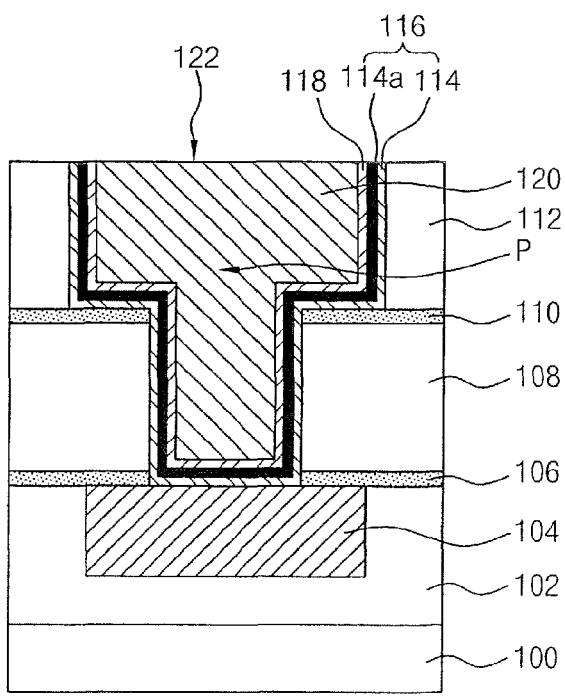

Referring to FIG. 2F, the metal layer 120 and the diffusion barrier are chemically and mechanically polished (CMP) until the second insulation layer 112 is exposed, thereby an upper metal line 122 that comes into contact with the lower metal line 104 is formed in the metal line forming region P.

Thereafter, although not shown in the drawings, a series of subsequent well known processes are sequentially conducted, and the metal line of a semiconductor device according to the present invention is completely formed.

As is apparent from the above description, in the present is invention, forming a copper metal line after forming a diffusion barrier including an amorphous TaBN layer improves the characteristics of a diffusion barrier and prevents the copper component of the metal line from diffusing. Accordingly, in the present invention, the characteristics and the reliability of a semiconductor device are improved.

Although specific embodiments of the present invention have been described for illustrative purposes, those skilled in the art will appreciate that various modifications, additions and substitutions are possible, without departing from the scope and the spirit of the invention as disclosed in the accompanying claims.

We claim:

1. A metal line of a semiconductor device, comprising:
   an insulation layer formed on a semiconductor substrate and having a metal line forming region;
   a metal line formed to fill the metal line forming region of the insulation layer; and
   a diffusion barrier formed between the metal line and the insulation layer and comprises a stack of a Ta$_x$B$_y$ layer and the amorphous TaBN layer,
   wherein the Ta$_x$B$_y$ layer is formed on a surface of the insulation layer and a surface of the metal line forming region, and the amorphous TaBN layer is formed on the Ta$_x$B$_y$ layer.

2. The metal line according to claim 1, wherein the metal line forming region has a structure including a trench or a trench and a via hole.

3. The metal line according to claim 1, wherein the diffusion barrier further comprises a TaN layer,
   wherein the TaN layer is formed between the surface of the insulation layer and the Ta$_x$B$_y$ layer, and between the surface of the metal line forming region and the Ta$_x$B$_y$ layer.

4. The metal line according to claim 3, wherein, the Ta$_x$B$_y$ layer has a hexagonal structure, wherein x has a range of 0.8~1.2 and y has a range of 1.8~2.2.

5. The metal line according to claim 1, further comprising:
   a seed layer interposed between the diffusion barrier and the metal line and made of an Ru layer.

6. The metal line according to claim 1, wherein the metal line is made of a copper layer.

* * * * *